United States Patent [19]

Iwatsuka et al.

[11] Patent Number: 5,383,270
[45] Date of Patent: Jan. 24, 1995

[54] METHOD FOR MOUNTING COMPONENT CHIPS AND APPARATUS THEREFOR

[75] Inventors: Yoshihisa Iwatsuka; Takeshi Tamiwa, both of Iwata, Japan

[73] Assignee: YamahaHatsudoki Kabushiki Kaisha, Iwata, Japan

[21] Appl. No.: 69,975

[22] Filed: May 28, 1993

[30] Foreign Application Priority Data

Jun. 5, 1992 [JP] Japan .................. 4-171931

[51] Int. Cl.⁶ .......................... H05K 3/34; B23P 21/00
[52] U.S. Cl. ........................... 29/840; 29/721; 29/740; 29/832
[58] Field of Search ............ 29/832, 833, 740, 840, 29/741, 720, 721

[56] References Cited

U.S. PATENT DOCUMENTS

| | | | |
|---|---|---|---|
| Re. 33,974 | 6/1992 | Asai et al. ................ | 29/721 X |
| 4,404,741 | 9/1983 | Lebet ..................... | 29/721 |
| 4,476,626 | 10/1984 | Gumbert et al. ........... | 29/840 X |
| 4,628,464 | 12/1986 | McConnell ............... | 29/721 X |
| 4,738,025 | 4/1988 | Arnold ................... | 29/833 |
| 4,867,569 | 9/1989 | Mohara .................. | 29/721 X |
| 4,980,971 | 1/1991 | Bartsehat et al. ........... | 29/833 |
| 5,079,834 | 1/1992 | Itagaki et al. ............. | 29/840 |
| 5,084,959 | 2/1992 | Ando et al. .............. | 29/833 X |
| 5,084,962 | 2/1992 | Takahashi et al. .......... | 29/833 |
| 5,086,559 | 2/1992 | Akatsuchi ............... | 29/833 X |
| 5,216,804 | 6/1993 | Rosier et al. .............. | 29/832 X |
| 5,224,262 | 7/1993 | Takaichi et al. ............ | 29/740 |

*Primary Examiner*—Carl J. Arbes
*Attorney, Agent, or Firm*—Knobbe, Martens, Olson & Bear

[57] ABSTRACT

A method and apparatus for mounting components on a substrate that insures that if the component, because of its shape can only be mounted if picked up in a specific area will not attempt mounting unless the component is picked up in that specific area. Various methods for setting and determining desirable pick up locations are disclosed.

14 Claims, 7 Drawing Sheets

METHOD FOR MOUNTING COMPONENT CHIPS AND APPARATUS THEREFOR

BACKGROUND OF THE INVENTION

This invention relates to a method and apparatus for mounting components and more particularly to an improved method and apparatus for this purpose.

Various devices have been proposed for picking up small electronic components such as chips containing a circuit and mounting those components on a substrate such as a printed circuit board. Normally a vacuum type pick-up is employed for picking up the components to be mounted. Various devices have been proposed so as to recognize the component that is picked up and have its center aligned with the mounting nozzle and thus positioned appropriately on the substrate or circuit board.

However, many of these types of components have a surface that may be irregular in shape and if an attempt is made to mount these components, a portion of the component may not be fully in contact with the circuit board. Such types of chips having abnormal shapes are MELF, ceramic capacitors, aluminum electrolytic capacitors, fixed inductors of the chip type and semi-fixed volume chips. These types of devices have curved corners or may be tall and unstable. Thus, with these types of components it may not always be desirable to pick up the component at its center for assembly on to the board because of the aforenoted difficulties.

It is, therefore, a principal object of this invention to provide an improved method and apparatus for mounting components on a substrate.

It is a further object of this invention to provide a method and apparatus for mounting irregular shaped components on a substrate or board.

It is a further object of this invention to provide a method and apparatus which permits successful mounting of components on a circuit board even if those components have irregular shapes.

SUMMARY OF THE INVENTION

This invention is adapted to be embodied in a component mounting apparatus for mounting a component on a substrate. The apparatus comprises a component handling device adapted to pick up a component and mount the component on the substrate. Means are provided for detecting the position of the component when held by the component handling device.

In accordance with an apparatus embodying the invention, means are provided for rejecting the mounting of the component on the substrate if the component is not held by the component handling device at a location where the component is likely to be successfully mounted on the substrate.

In accordance with a method of practicing the invention, if the component is not determined to be held by the component handling device at a location where the component is likely to be successfully mounted on the substrate, the mounting process is disabled.

DETAILED DESCRIPTION OF THE PREFERRED EMBODIMENTS OF THE INVENTION

Figure 1:
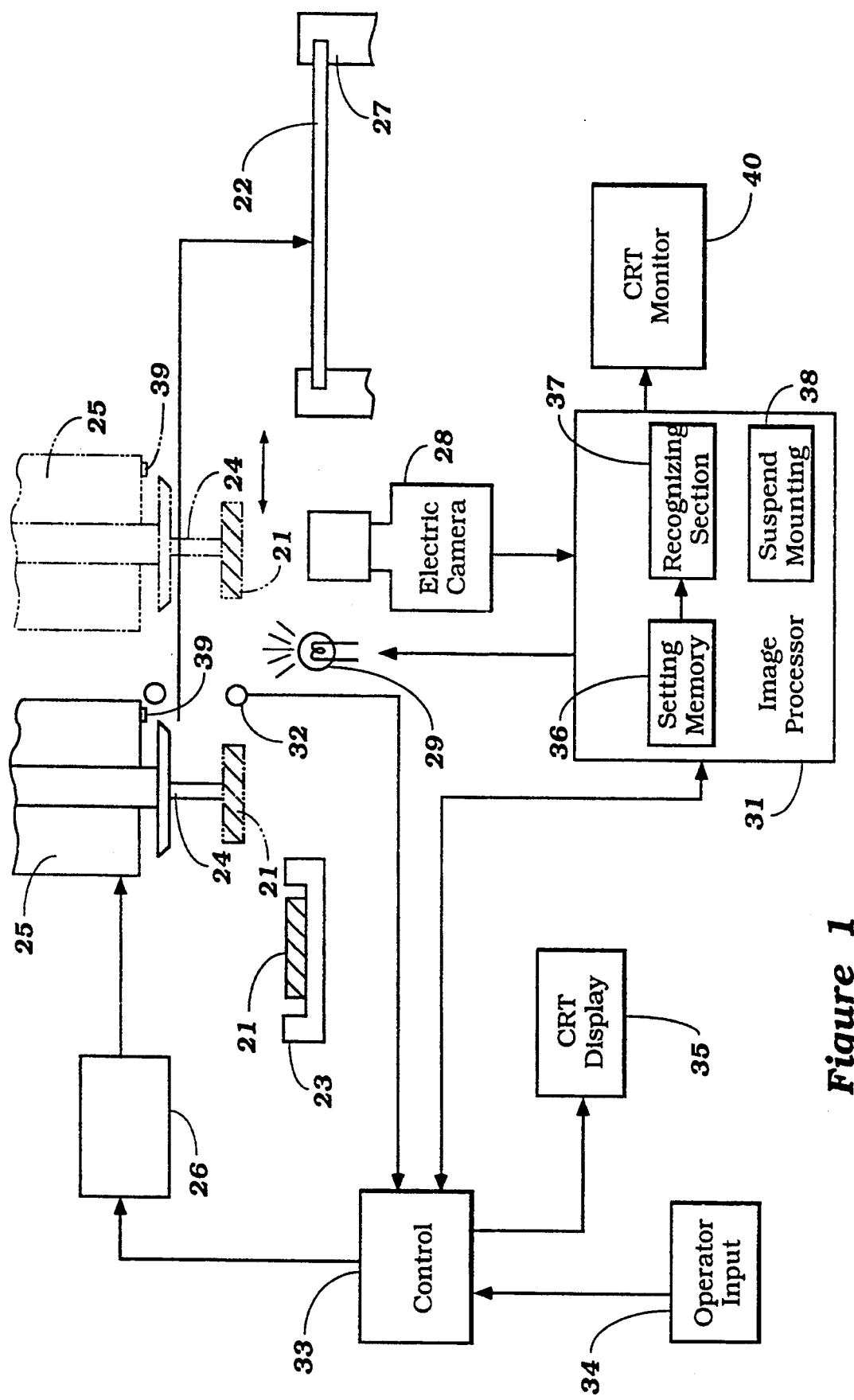
FIG. 1 is a partially schematic view of a component mounting apparatus constructed in accordance with an embodiment of the invention, with the pick-up head being shown in an intermediate position and in a position over the electronic camera in solid and phantom lines, respectively.

Referring first to FIG. 1, an apparatus constructed and operated in accordance with a method for practicing the invention is illustrated. Certain of the components are shown schematically where their detailed construction forms no important part of the invention. Also, some of the components are shown schematically. The apparatus is designed to mount electronic components such as chips or the like, indicated generally at 21 on a substrate, indicated generally at 22 which substrate may consist of a printed circuit board.

The apparatus includes a conveyor 23 which delivers the components 21 to a pick-up station. It should be readily apparent, however, that the component conveyor 23 may in actual practice comprise a delivery reel on which the components 21 are carried as is well known in this art. Thus, the components are shown generally schematically since the actual construction of the various components used to practice the invention can be varied to suit particular applications as will be readily apparent to those skilled in the art.

A pick-up nozzle 24, which may be of the vacuum type, is carried by a head 25 that is mounted for movement in a preselected path and which is operated by a drive 26 for movement between a position in registry over the component conveyor 23 and a position over a circuit board conveyor 27 on which the substrates or circuit boards 23 are presented. Between the component conveyor 23 and the substrate conveyor 27 there is positioned a recognition and determination section that includes an electronic camera 28 and a light source 29 which are both connected with an image processor 31 which includes certain sections, as will become apparent. There is further provided a position detector 32 which is juxtaposed to the electronic camera 28 and which sends a signal to a control 33 when the mounting head 25 passes it.

The control 33 receives signals from an operator input 34 such as a key board or the like so as to program the control 33 so as to move the mounter head 25 and pick-up nozzle 24 in an appropriate position both over the conveyor 23 for the chips or components 21 and over the conveyor 27 so that the component can be mounted at the appropriate location on the substrate or circuit board 22. In addition, a CRT display 35 is positioned at the operator's station and the operator can see the component 21 carried by the pick-up nozzle 24 before it is mounted or at any time during the operation, as may be desired.

The image processor 31 includes a setting memory 36 on which information regarding the various chips and/or components to be mounted can be displayed such as the shape of the component and the acceptable pick-up area on the component. There is also provided a recognizing section 37 that receives the input from the electronic camera 28 and the information from the memory 36 so as to indicate the actual position of the component on the pick-up nozzle 24 and also to determine if the component is being held at the acceptable pick-up area. In the event it is not, a signal is outputted to a section 38 which initiates the suspend mounting operation of the control 33 so as to prevent mounting of the improperly picked up component 21 from the pick-up nozzle 24. The rejected component may be returned back to the chip conveyor section 23 for another pick up try or maybe placed in a reject bin, as desired. The image processor 31 also outputs a picture of the view of the camera 28 to a CRT display 40.

The apparatus further includes, in accordance with one embodiment of the invention, a recognition spot 39 which is placed on the mounter head 25 for the purpose of determining the location of the mounter head 25 and pick-up nozzle 24 relative the electric camera 28. The recognition spot 39 may be deleted in embodiments where the control 33 and specifically the driver 26 is programmed to position the mounting head 25 and chip mounter head 24 in the same position it is in registry with the electronic camera 28 and such as in the embodiment of FIGS. 4 and 5.

Figure 2:
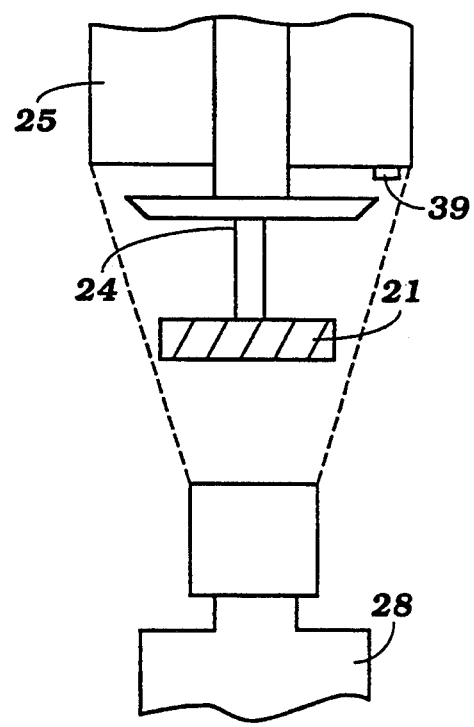
FIG. 2 is an enlarged view showing the mounter and held component in proximity to the electronic camera.
Figure 3:
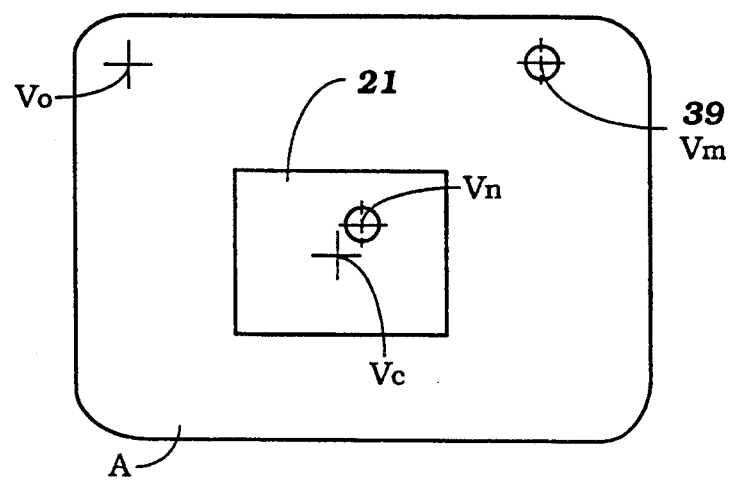
FIG. 3 is a view showing the scene as viewed by the camera and illustrates one way in which the appropriate positioning of the component may be determined in accordance with this embodiment.

FIGS. 2 and 3 show the arrangement where the chip 21 is determined to be or not to be picked up at the acceptable pick-up area. When the position sensor 32 sensor senses that the mounting head 25 is in position above the electronic camera 28, the light source 29 is illuminated and the camera 28 takes a picture of the above scene and this picture appears in FIG. 3 wherein the viewing area of the camera is indicated by the area "A". The camera has memorized into it a fixed coordinate origin $V_o$ for reference purposes in its visual field "A".

The camera will see the reference mark 39 at the point $V_m$ and from this can compute where the center of the pick-up nozzle 24 is. This is the point $V_n$. Then the camera can recognize from the shape of the component and the information from the memory 36 to determine the center of the component $V_c$. Once this information is determined, then the device computes whether the component has been picked up in an appropriate area since the pick-up area is readily determined from the location of the pick-up nozzle $V_n$ relative to the chip center $V_c$, all of which are determined as aforenoted.

The acceptable area for the chip or component 21 is determined as an area where, when picked up by the pick-up nozzle 24 the chip or component 21 can be successfully mounted on the substrate 22. This determination will be based upon the shape of the component and specifically its lower surface which will come into contact with the circuit board or substrate 22 and also its upper surface which is picked up by the nozzle 24. The manner in which this determination is made for various chips will be described later.

Figure 4:
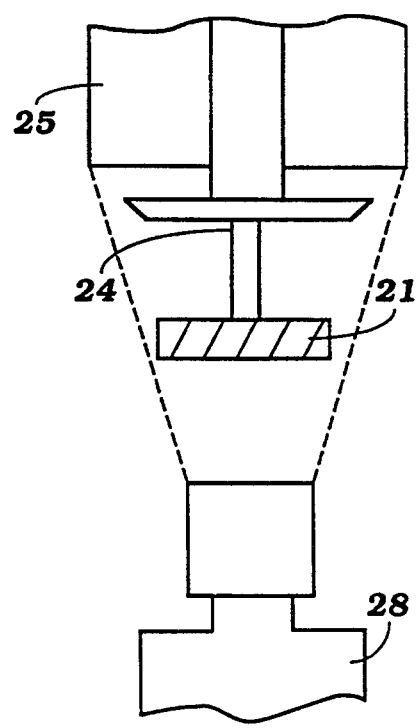
FIG. 4 is an enlarged side elevational view, in part similar to FIG. 2, and shows another form of apparatus for practicing the invention.
Figure 5:
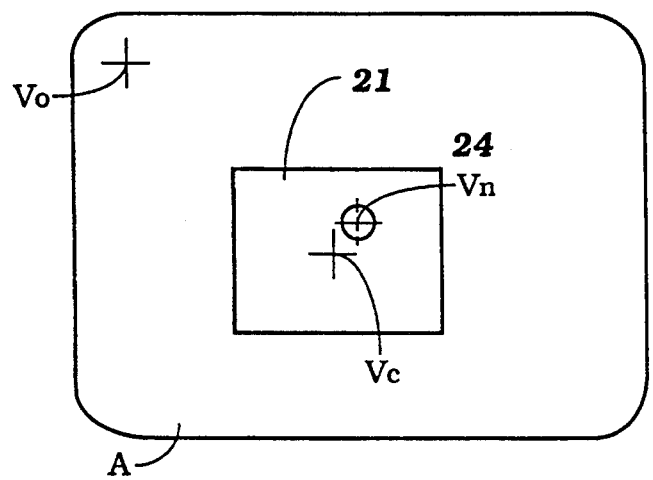
FIG. 5 is a view in part similar to FIG. 3, and shows how this apparatus determines the component position.

FIGS. 4 and 5 show another embodiment of the invention wherein the head 23 does not have the recognition spot 39. Rather, in this embodiment the control 33 and drive 26 is configured so as to always place the nozzle center $V_n$ centrally of the viewing area "A" of the electronic camera 28. In this embodiment, the location of the center of the nozzle $V_n$ as shown in FIG. 5, will always be in the same place. Hence, when the image of the chip or component 21 is recorded on the electronic camera 28 as shown in FIG. 5, then its center $V_c$ can be determined from the information in the memory 36 and by recognizing section 37 of the image processor 31. Again, this will then provide sufficient information so as to permit the device to determine if the chip or component 21 is positioned so that it can be successfully mounted on the circuit board or substrate 22.

Figure 6:
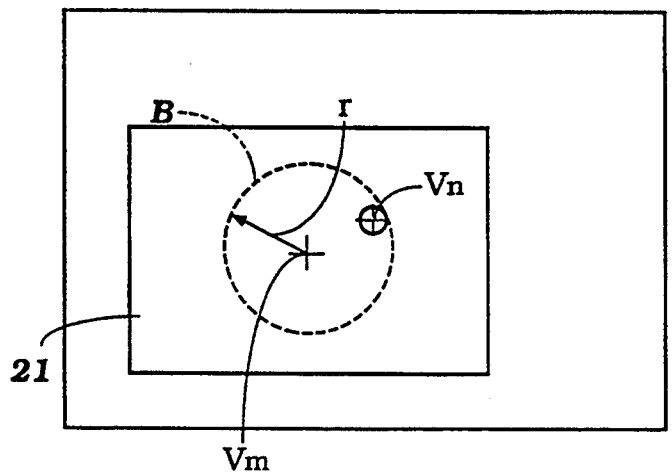
FIG. 6 is a view showing a component of a first type and how the effective pick-up area of the component is determined.

FIGS. 6 through 9 show various types of chips and the acceptable pick-up areas thereon so that the device can determine if the chips or components have been picked up at the acceptable pick-up area. In each figure the acceptable area is indicated by the broken line "B". In FIG. 6, the chip 21 has its effective pick-up area "B" lying within a circle having a radius "R" from the chip center $V_c$. Hence, as long as the pick-up nozzle $V_n$ is within the circle "B" it is determined that the chip can be successfully mounted.

Figure 7:
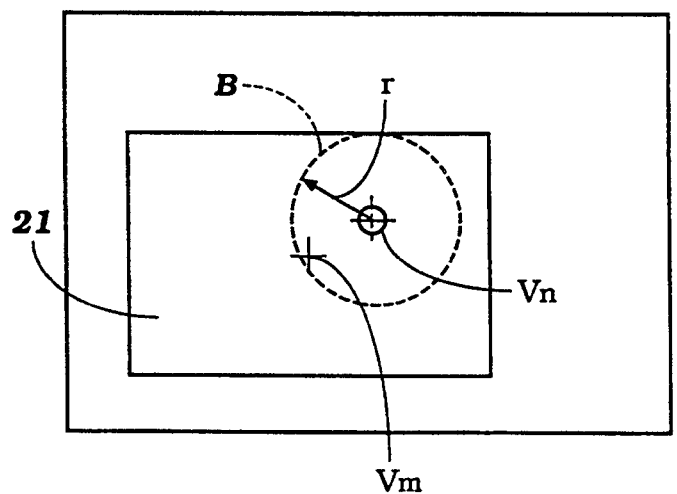
FIG. 7 is a view in part similar to FIG. 6, and shows another type of component and how its effective pick-up can be determined.

In FIG. 7, the effective pick-up area "B" lies within a radius "r" of the center pick-up nozzle $V_n$ and this is determined as being the effective area where mounting can be successfully completed.

Figure 8:
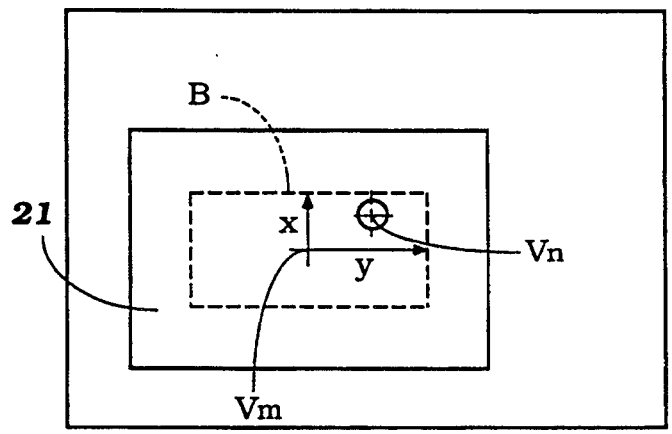
FIG. 8 is a view in part similar to FIGS. 6 and 7, and shows another type of component and how its effective pick-up area can be determined.

The effective area in FIG. 8 is described by a rectangle "B" having "x-y" coordinates relative to the chip center $V_m$ and as long as the pick-up nozzle $V_n$ is within this area, then mounting will be successful.

Figure 9:
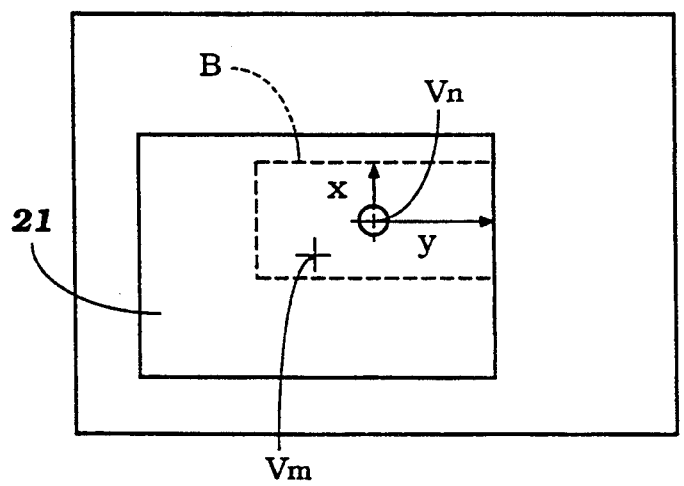
FIG. 9 is a view in part similar to FIGS. 6 through 8 and shows another embodiment of the component and how its effective pick-up area can be determined.

In FIG. 9, the rectangular coordinates are described from the nozzle center $V_n$ with the effective area being indicated by the rectangle "B".

Figure 10:
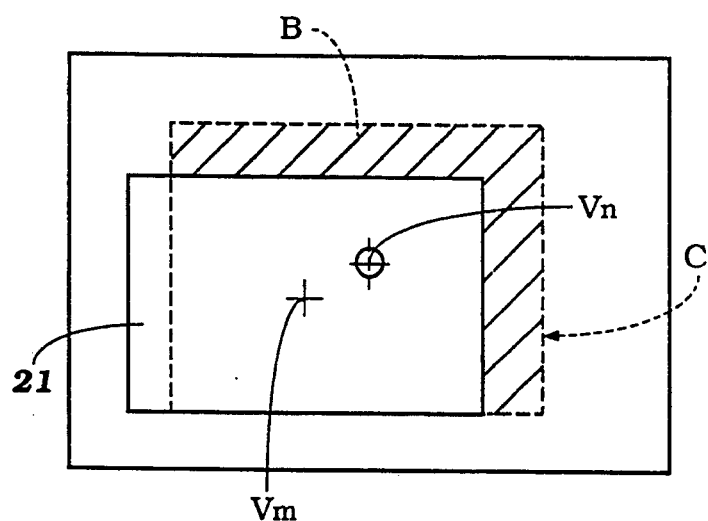
FIG. 10 is a view in part similar to FIGS. 6 through 9 and shows another form of component and how its effective pick-up area can be determined.

FIG. 10 shows another embodiment and way in which it can determined if the chip 21 or component has been picked up in the acceptable pick-up area. The way this is done is that the camera measures the area of the chip within an imaginary rectangle "C" by determining the unshaded area of this rectangle which is indicated at "B". If the ratio of the area obscured is greater than a predetermined amount, it is known that the chip has been picked up in the acceptable area for mounting and mounting can be completed.

Of course, the foregoing examples are only a few examples of ways in which the acceptable pick-up of the chip or component can be determined.

Figure 11:
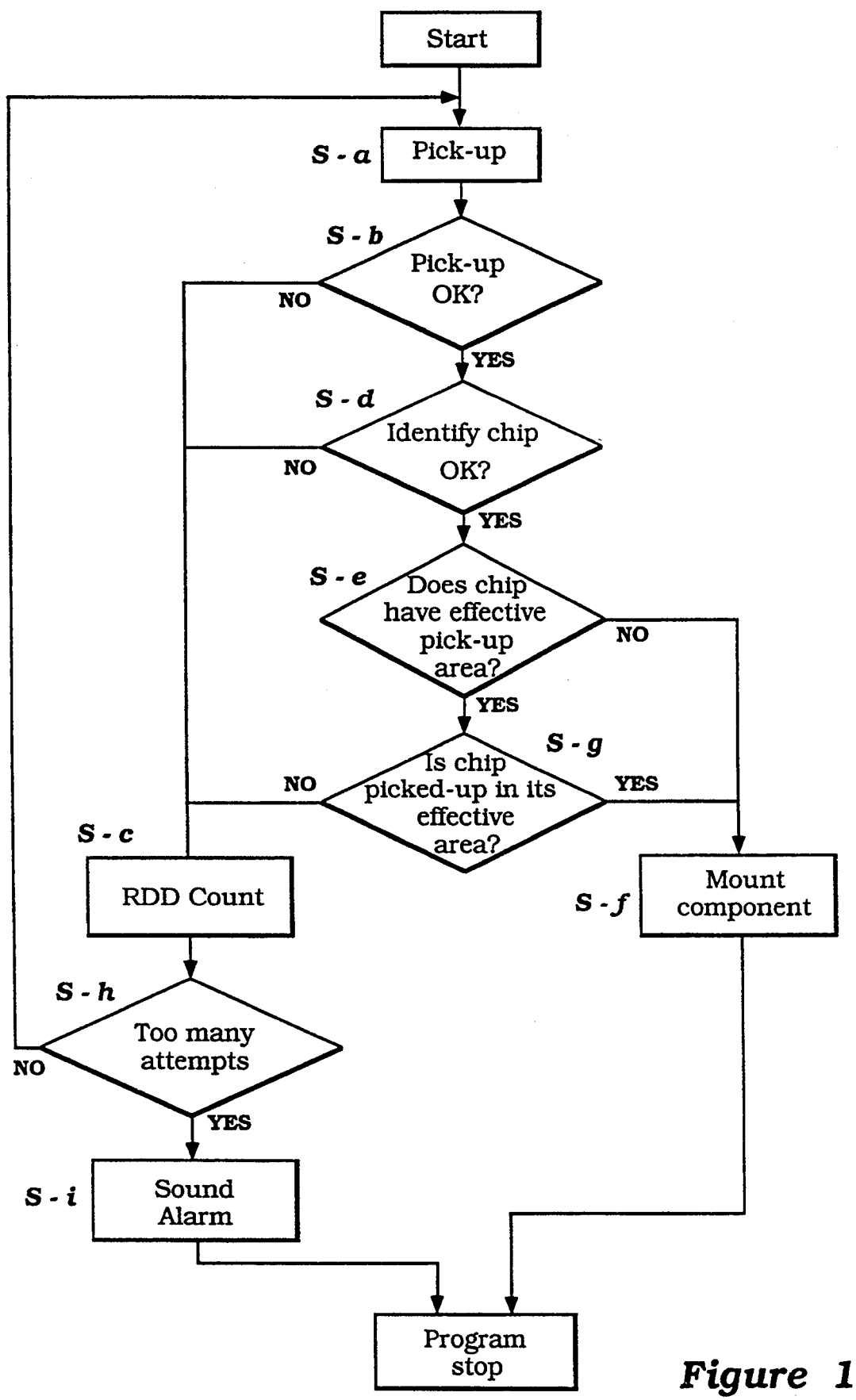
FIG. 11 is a graphical view showing the control routine in accordance with an embodiment of the invention.

One type of control routine is shown in FIG. 11 and will now be described by reference to that figure. When the program starts it moves to the Step S-a to effect picking up of the chip or component 21 from the chip or conveyor or pick-up station 23. The program then moves to the Step S-b to determine that the chip has actually been picked up by the pick-up nozzle 24. This can be done by sensing a change in the vacuum pressure of the pick-up nozzle or by a position detector carried by the pick-up nozzle or various other manners.

If, at the Step S-b it is determined that a chip has not been picked up successfully by the pick-up nozzle 24, the program moves to the Step S-c to add a count to a counter which will determine the number of times when pick up has been attempted. The program then moves to the Step S-g to determine if the number of attempts at picking up has exceeded a predetermined number of attempts. If it has not, the program returns to the Step S-a to again attempt a pick up. If, however, at the Step S-h the controller 33 determines that too many pick up attempts have been unsuccessfully made, the program will move to the Step S-i to sound an alarm or otherwise warn the operator and then will stop the program.

If, however, at the Step S-b it has been determined that a chip has been successfully attracted by the pick-up nozzle 24, then the program continues to cause the mounting head 25 to move into proximity with the electronic camera 28 and, at that time, the program moves to the Step S-d so that the identity of the chip is determined by comparing the outline of the chip as seen by the camera 28 in the recognizing section 37 of the image processor 31 with those stored in the memory 36. If the chip is not appropriately identified, the program moves to the return mode at Step S-c to repeat a pick up of the chip because it is assumed that either a chip has not been properly picked up or what has been picked up is not an appropriate chip for mounting. Again, if too many attempts are made the program will sound the alarm at the Step S-i and stop the program.

Assuming, however, at the Step S-d the chip has been recognized, the program moves to the Step S-e to determine if the particular chip or component being picked up has an effective pick up area. As noted above, not all components or chips are sensitive to the point at which they are picked up. If the chip does not have an effective pick up area (can be picked up effectively at any location on it) the program moves to the Step S-f to move the mounting head 25 into proximity with the substrate or circuit board 22 and mount the component 21.

If at the Step S-e it has been determined that the component has an effective pick-up area, the program then moves to the Step S-g so as to determine if the component has been picked up in its effective area, by one of the recognition methods already described. If the component has, then it is mounted at the Step S-f. If, however, it has not been picked up in its effective area, then another pick up attempt is made at the Steps S-c, S-h and S-a so long as the number of attempts has not exceeded the predetermined maximum number of tries.

It should be readily apparent from the foregoing description that the described embodiments of the invention are extremely effective in insuring that components to be mounted automatically are picked up in an area where they can be successfully mounted, even if those components have irregular shapes which dictate that they can be successfully mounted only if picked up in acceptable pick-up areas. Of course, the foregoing description is that of preferred embodiments of the invention and various changes and modifications may be made without departing from the spirit and scope, as defined by the appended claims.

We claim:

1. A method for mounting a component on a substrate, said component having a pick up surface on one side and a mounting surface on another side, said mounting surface being configured so that a mounting force must be applied to a specific area of said pick up surface to insure effective mounting of said substrate, said specific area being smaller than the area of said pick up surface, using an apparatus comprising a component handling device having a pick up portion for picking up a component and mounting that component on a substrate, said pick up portion having a smaller effective area than said specific area of said pick up surface comprising the steps of detecting the position on said mounting surface where the component is held by the component handling device, and rejecting the mounting of the component of the substrate if the component is not held by said component handling device within said specific area of said pick up surface.

2. A method for mounting a component as set forth in claim 1 wherein the component handling device comprises a vacuum pick up.

3. A method for mounting a component as set forth in claim 1 wherein the position the component is held by the component handling device is determined by an electronic camera.

4. A method for mounting a component as set forth in claim 3 wherein the position the component is held by the component handling device is compared with a predetermined memorized acceptable pick-up area.

5. A method for mounting a component as set forth in claim 4 wherein the detection of the position of the component is determined relative to an identifying position on the component handling device.

6. A method for mounting a component as set forth in claim 4 wherein the detection of the position of the component is accomplished by positioning the component handling device at a predetermined location relative to the camera.

7. A method for mounting a component as set forth in claim 6 wherein the component handling device comprises a vacuum pick up.

8. A component mounting apparatus for mounting a component on a substrate, said component having a pick up surface on one side and a mounting surface on another side, said mounting surface being configured so that a mounting force must be applied to a specific area of said pick up surface to insure effective mounting on said substrate, said specific area being smaller than the area of said pick up surface, said apparatus comprising a component handling device having a pick up portion for picking up a component and mounting that component on a substrate, said pick up portion having a smaller effective area than said specific area of said pick up surface, means for detecting the position on said mounting surface where said component is held by the component handling device, and means are provided for rejecting the mounting of the component of the substrate if the component is not held by said component handling device within said specific area of said pick up.

9. A component mounting apparatus as set forth in claim 8 wherein the component handling device comprises a vacuum pick up.

10. A component mounting apparatus as set forth in claim 8 wherein the means for detecting the position the component is held by the component handling device comprises an electronic camera.

11. A component mounting apparatus as set forth in claim 10 wherein the means for detecting the position the component is held by the component handling device compares the location of the component with a predetermined memorized acceptable pick-up area.

12. A component mounting apparatus as set forth in claim 11 wherein the means for detecting the position of the component further includes an identifying position on the component handling device.

13. A component mounting apparatus as set forth in claim 11 wherein the means for detecting the position of the component further includes means for positioning the component handling device at a predetermined location relative to the camera.

14. A component mounting apparatus as set forth in claim 13 wherein the component handling device comprises a vacuum pick up.

* * * * *